(12) United States Patent
Trezza et al.

(10) Patent No.: US 6,485,993 B2
(45) Date of Patent: Nov. 26, 2002

(54) METHOD OF MAKING OPTO-ELECTRONIC DEVICES USING SACRIFICIAL DEVICES

(75) Inventors: John A. Trezza, Nashua; Gregory K. Dudoff, Amherst, both of NH (US)

(73) Assignee: Teraconnect Inc., Nashua, NH (US)

( * ) Notice: Subject to any disclaimer, the term of this patent is extended or adjusted under 35 U.S.C. 154(b) by 30 days.

(21) Appl. No.: 09/727,940

(22) Filed: Dec. 1, 2000

(65) Prior Publication Data

US 2002/0072138 A1 Jun. 13, 2002

Related U.S. Application Data

(60) Provisional application No. 60/168,493, filed on Dec. 2, 1999.

(51) Int. Cl.[7] .............................................. H01L 21/00
(52) U.S. Cl. .............................. 438/22; 438/28; 438/57; 438/455; 438/107
(58) Field of Search .......................... 438/26, 25, 22, 438/57, 60, 65, 455, 459, 27, 28, 24, 107, 109, 128

(56) References Cited

U.S. PATENT DOCUMENTS

| | | | |
|---|---|---|---|
| 5,099,306 A | | 3/1992 | Dunaway et al. |
| 5,387,269 A | | 2/1995 | Nijander et al. |
| 5,401,983 A | | 3/1995 | Jokerst et al. |
| 5,465,009 A | * | 11/1995 | Drabik et al. ................ 257/723 |
| 5,557,120 A | * | 9/1996 | Martin et al. ................ 257/291 |
| 5,684,362 A | * | 11/1997 | Togawa ........................ 313/582 |
| 5,858,814 A | | 1/1999 | Goossen et al. |
| 5,894,218 A | | 4/1999 | Farnworth et al. |
| 5,926,694 A | | 7/1999 | Chigawa et al. |
| 6,144,779 A | | 11/2000 | Binkley et al. |
| 6,164,837 A | | 12/2000 | Haake et al. |
| 6,337,265 B1 | * | 1/2002 | Trezza et al. ................ 438/612 |
| 6,387,721 B1 | * | 5/2002 | Hashimoto et al. ........... 438/46 |

OTHER PUBLICATIONS

PCT International Search Report dated Apr. 27, 2001 of International Application No. PCT/US00/24134 filed Oct. 20, 2001.
Greig, W.J., Bendat, S., Saba, V.R., Flip Chip Technology: Achieving precise Placement and Attachment.
M. Ajmone Marsan et al, Modelling Slotted Multi–Channel Ring All–Optical Networks, *IEEE*, 1997, pp. 146–153.
Marco Ajmone Marsan et al, Access Protocols for Photonic WDM Multi–Rings with Tunable Transmitters and Fixed Receivers, *SPIE*, pp. 59–72, vol. 26921.
Carl Beckmann, Applications: Asynchronous Transfer Mode and Synchronous Optical Network, *Handbook of Fiber Optic Data Communication*, 1998, pp. 385–414, Academic Press.
Floyd E. Ross, An Overview of FDDI: The Fiber Distributed Data Interface, *IEEE Journal on Selected Areas in Communications*, Sep. 1989, pp. 1043–1051, vol. 7 No. 7.

* cited by examiner

*Primary Examiner*—Caridad Everhart
(74) *Attorney, Agent, or Firm*—Scott J. Asmus; Vernon C. Maine; Maine & Asmus

(57) ABSTRACT

A method for making optoelectronic devices with interdigitated arrays of photonic devices is disclosed wherein an array of first type photonic devices and sacrificial device(s) is hybridized to a driver circuitry substrate, the sacrificial devices are removed, and an array of second type photonic devices is hybridized into the spaces left by removal of the sacrificial devices.

13 Claims, 7 Drawing Sheets

METHOD OF MAKING OPTO-ELECTRONIC DEVICES USING SACRIFICIAL DEVICES

RELATED APPLICATIONS

This application claims priority from U.S. Provisional Patent Application Ser. No. 60/168,493, filed Dec. 2, 1999.

FIELD OF THE INVENTION

This invention relates to optical communication systems and more particularly to a process for making optical transceiver arrays.

BACKGROUND OF INVENTION

Optical couplers are now used to communicate optical signals over short and long distances between, for example, two computers, two circuit boards in one computer, and even two different chips on the same circuit board.

Integrated circuit technology that enables bi-directional, high-speed optical rather than electrical interconnections has been developed. This technology allows laser emitters and detectors to be integrated onto a semiconductor substrate, making electrical connection with electronic circuitry previously built on that substrate.

Thus, optical rather than electrical communications between electronic devices is accomplished. An optical transmitter-receiver module, or optoelectronic device, typically includes both light emitting devices such as vertical cavity surface emitting lasers (VCSELs) and light detecting devices such as photodiodes. Such a module more typically may include separate chips, or the VCSELs and the photodiodes may be grown on the same substrate. See U.S. Pat. No. 5,978,401 incorporated herein by this reference.

Driver-receiver circuit modules, typically in the form of ASIC chips, include driver circuitry which receives electrical signals from an electronic device and drives the VCSELs accordingly. The ASIC chips also include receiver circuitry for receiving signals from the photodiodes and processes those electrical signals providing an appropriate output to the associated electronic device.

The combination of the VCSELs and the photodiodes and the ASIC circuitry is typically called an optical transceiver. One way to hybridize the VCSELs and the photodiodes and the ASIC receiver circuitry is by flip-chip bonding. See U.S. Pat. No. 5,858,814, incorporated herein by this reference.

These different types of photonic devices, e.g., emitters and detectors, however, have very different epitaxial layer constructions and physical dimensions, and it is not economically feasible to grow such dissimilar devices on the same substrate. Therefore, separate growth steps must be performed for each device type. This method, in turn, restricts the number of different device types integrated onto the same silicon substrate.

SUMMARY OF THE INVENTION

It is therefore an object of this invention to provide a method for making a hybrid optoelectronic device with multiple types of photonic devices, such as emitters and detectors, integrated on the same silicon substrate.

It is a further object of this invention to provide a method of making a hybrid optoelectronic device with multiple types of photonic devices interdigitated on the same silicon substrate.

This invention results from the realization that an interdigitated array of photonic devices with at least two different photonic devices of different physical and epitaxial layer construction, can be produced with good electrical and mechanical interconnections by using a multistep hybridization process including the use of sacrificial, or dummy, devices in at least a first array of photonic devices. The sacrificial devices are removed before a second array of photonic devices is hydridized with the first array.

The present invention provides a method of making a hybrid optoelectronic device. The primary steps are hybridizing a first substrate and a second substrate, the second substrate including at least one first optical device and at least one sacrificial device and introducing a first flowable hardenable material to join the first and second substrates. The first flowable hardenable material is then cured. The second substrate is then removed as is the at least one sacrificial device. The method also includes hybridizing the first substrate and a third substrate, the third substrate including at least one second optical device; introducing a second flowable hardenable material to join the first and third substrates; curing the second flowable hardenable material; and removing the third substrate.

The first substrate material may be silicon. The second and third substrate materials may be GaAs. The flowable hardenable materials may be curable epoxy resins.

The photonic devices may be emitters, transmitters and/or modulators. Modulators may be reflective, transmissive or absorptive and may modulate a received signal based on amplitude, wavelength or phase.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
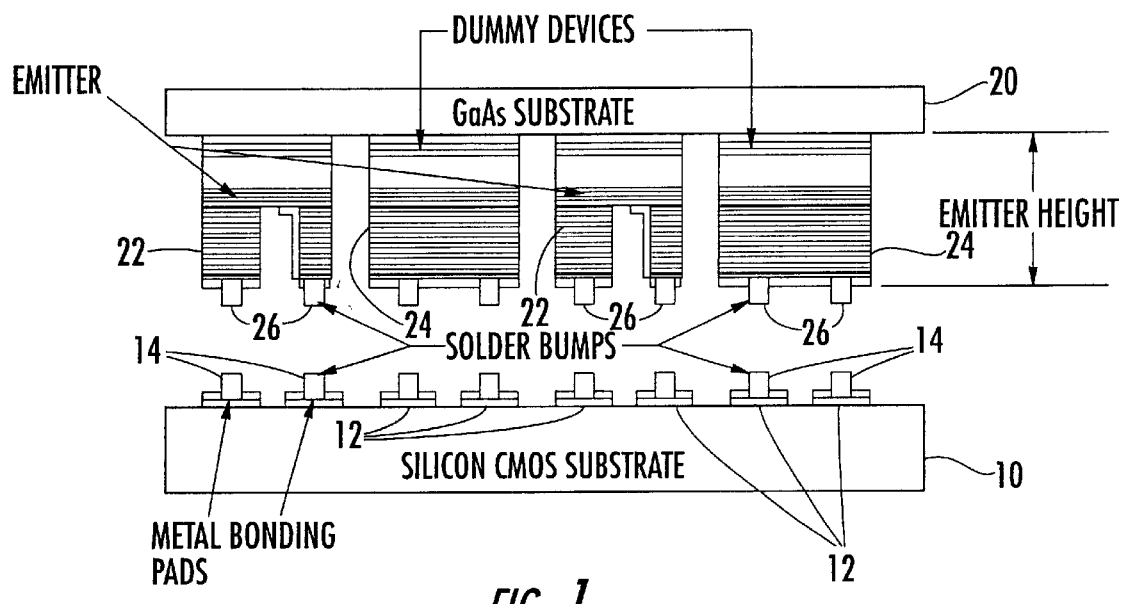
FIG. 1 is a cross-sectional view of a silicon substrate and a first GaAs substrate, with first optical and sacrificial devices thereon, before hybridization.

As shown in FIG. 1, silicon substrate 10, with driver circuitry (not shown), has metal bonding pads 12 and solder bumps 14 formed on one surface thereof. GaAs substrate 20 has emitters 22 and sacrificial devices 24 grown epitaxially on one surface thereof. Emitters 22 and sacrificial devices 24 also have solder bumps 26 formed thereon which align with solder bumps 14 on silicon substrate 10. Emitters 22 are identical, having been grown on the same GaAs substrate with the same epitaxial layer construction. Similarly, sacrificial devices 24 have the same epitaxial layer construction.

While substrate 20 is preferably GaAs, it may be of any material compatible with the growth of epitaxial layers of III–V materials that support light emission, such as GaAs or InP. This includes II–V materials, sapphire and organic polymers.

Figure 2:
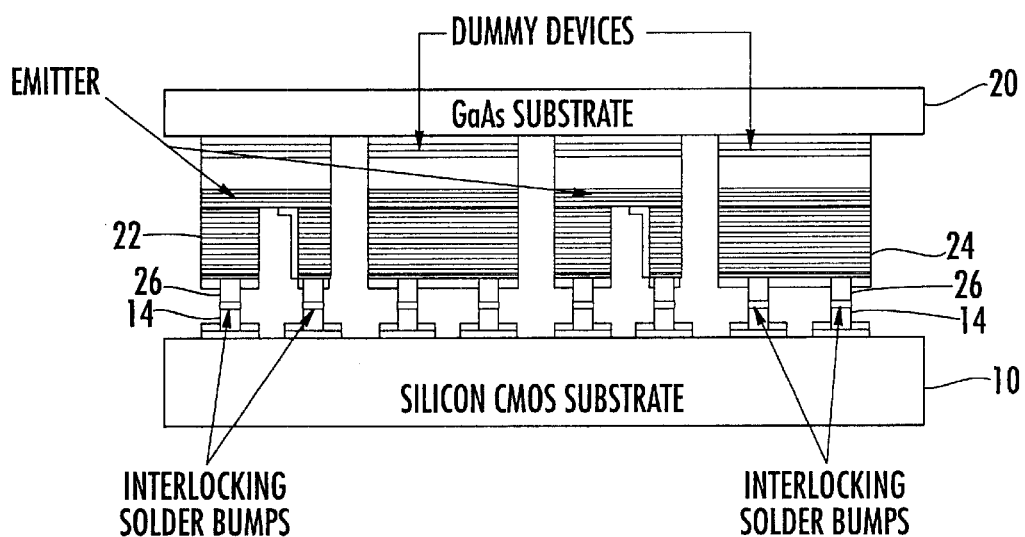
FIG. 2 is a cross-sectional view of the substrates of FIG. 1 after hybridization.

The emitter attachment step is performed by pressing GaAs substrate 20 and silicon substrate 10 together as shown in FIG. 2. During this process, the surfaces of solder bumps 14 interlock with the corresponding solder bumps 26, thereby developing a low electrical resistance, mechanically stable connection in each aligned solder bump pair. This process is also referred to as "hybridizing."

Figure 3:
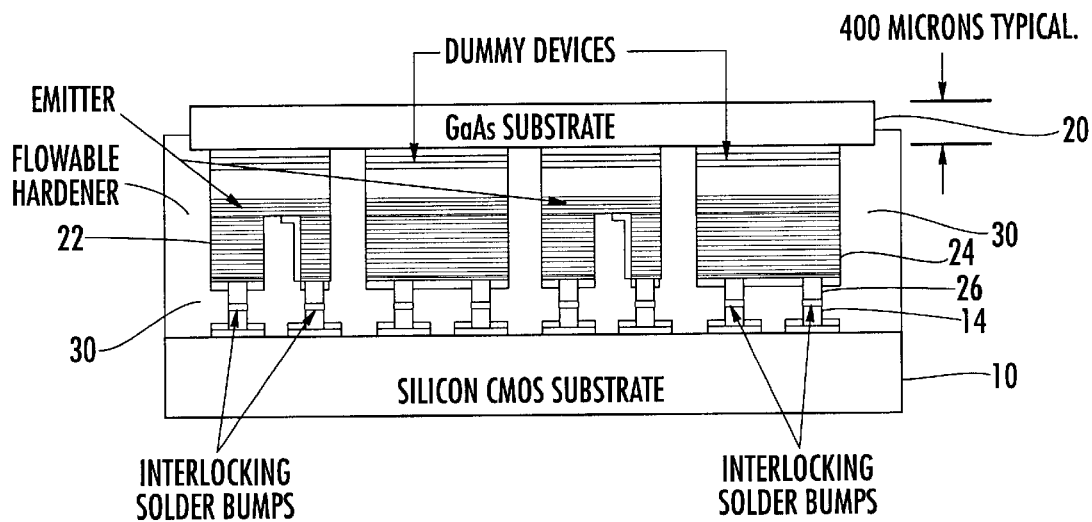
FIG. 3 is a cross-sectional view of the hybridized substrates of FIG. 2 after a first flowable hardenable material has been introduced.

After the pressing step is complete, a flowable hardenable material 30 (FIG. 3), such as an epoxy resin, is introduced into the spaces between and around emitters 22 and sacrificial devices 24. Flowable hardenable material 30 provides physical stability for emitters 22 during the subsequent processing steps. Once flowable hardenable material 30 is introduced, it is cured as appropriate, such as exposure to UV light if a UV-curable epoxy resin is used.

Figure 4:
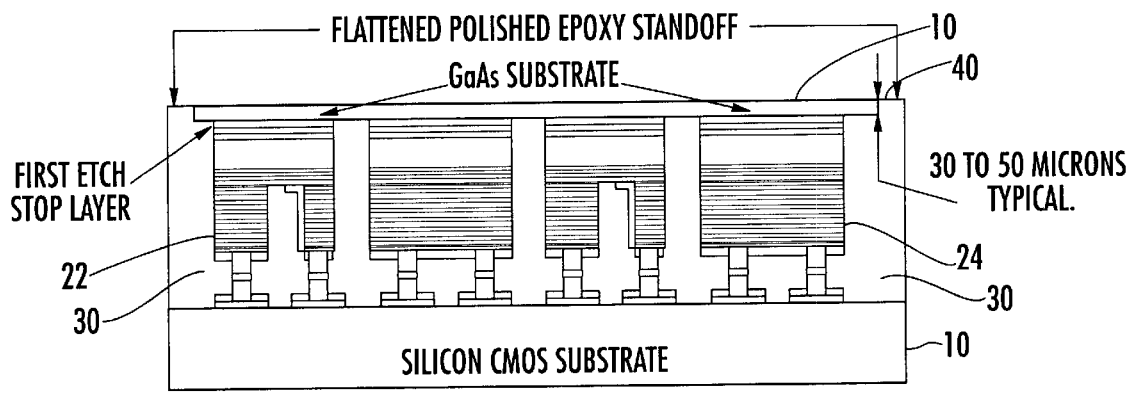
FIG. 4 is a cross-sectional view of the device of FIG. 3 after mechanical lapping to remove most of the first GaAs substrate.

Next, the bulk of substrate 20 is removed using a mechanical lapping process or other suitable mechanical process, as shown in FIG. 4. Preferably, the thickness of substrate 20 remaining after the mechanical lapping process is complete is in the range of 10 to 50 microns. The mechanical lapping process also leaves polished epoxy standoff 40, which can be used to attach faceplates or microlens to the finished optical transceiver device.

Figure 5:
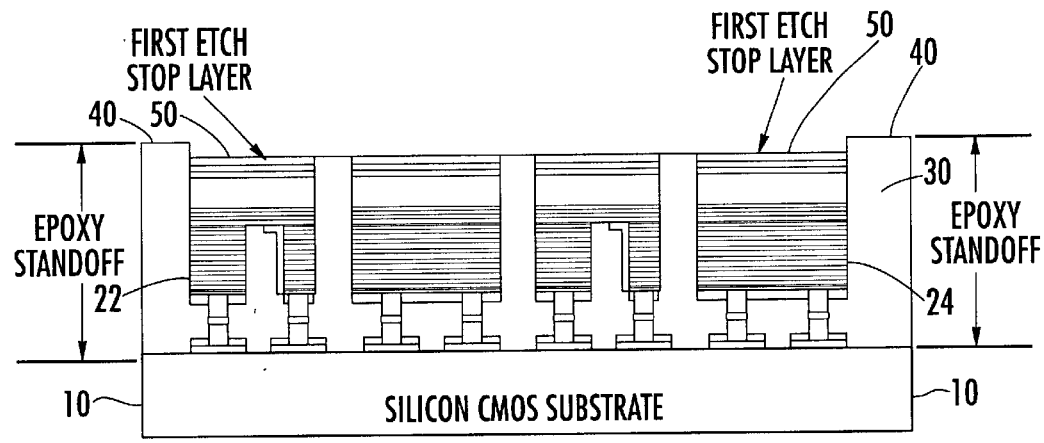
FIG. 5 is a cross-sectional view of the device of FIG. 4 after etching to remove the remainder of the first GaAs substrate.

A selective dry chemical etch is then used to remove the rest of substrate 20 as shown in FIG. 5. Various dry etch formulations enable selective removal of semiconductor material. For example, to remove a GaAs substrate, a dry etch composition consisting of $SiCl_4/SF_6$ can be used. The dry etch process is complete when etch stop layer 50 is reached. Etch stop layer 50 is composed of material which is not susceptible to dry etching by the dry etch composition used to remove substrate 20.

Figure 6:
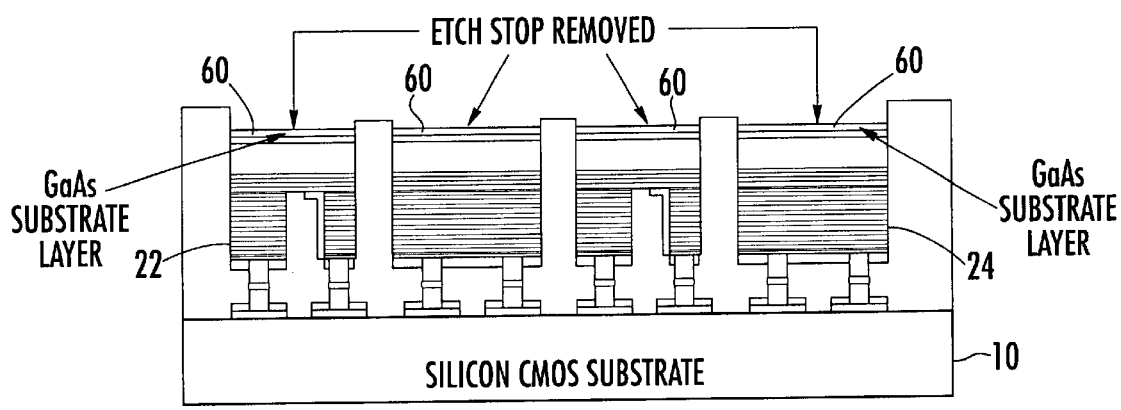
FIG. 6 is a cross-sectional view of the device of FIG. 5 after removal of the etch stop layer.

A separate dry etch step is used to remove etch stop 50, as shown in FIG. 6. Again, the dry etch composition selected removes only etch stop layer 50, leaving GaAs layer 60 exposed.

Figure 7:
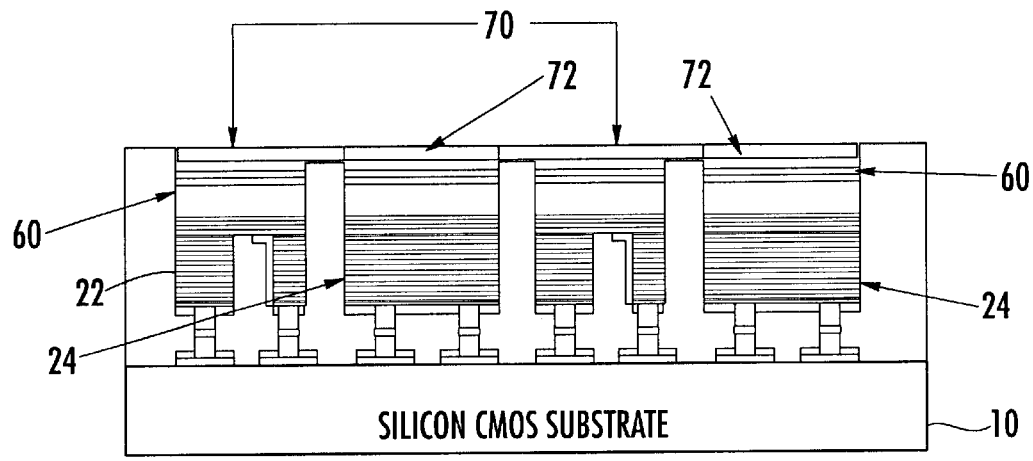
FIG. 7 is a cross-sectional view of the device of FIG. 6 with a process mask applied thereto.
Figure 8:
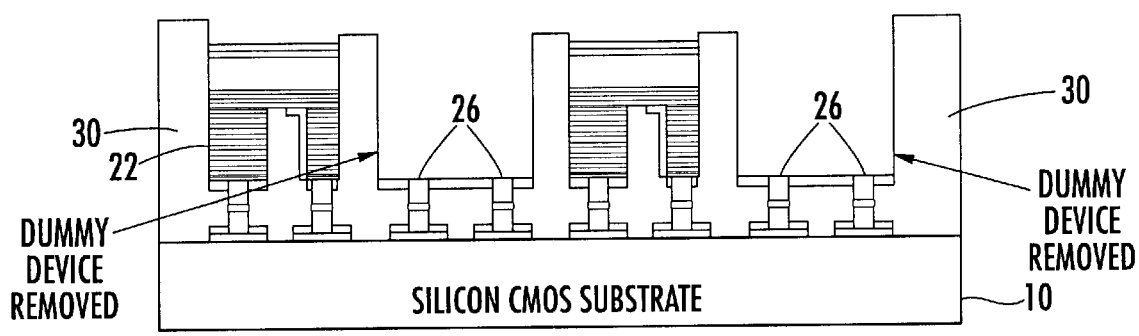
FIG. 8 is a cross-sectional view of the device of FIG. 7 after removal of the sacrificial devices.

As shown in FIG. 7, process mask 70 is placed over the top surface of the devices. Process mask 70 protects emitters 22 but has openings 72 that expose sacrificial devices 24. Openings 72 allow a selective wet chemical etch to remove sacrificial devices 24. This wet chemical etch does not remove solder bumps 26 or epoxy 30, as shown in FIG. 8.

Typical compositions for the wet chemical etch would include $Br_2$ and HBr.

Figure 9:
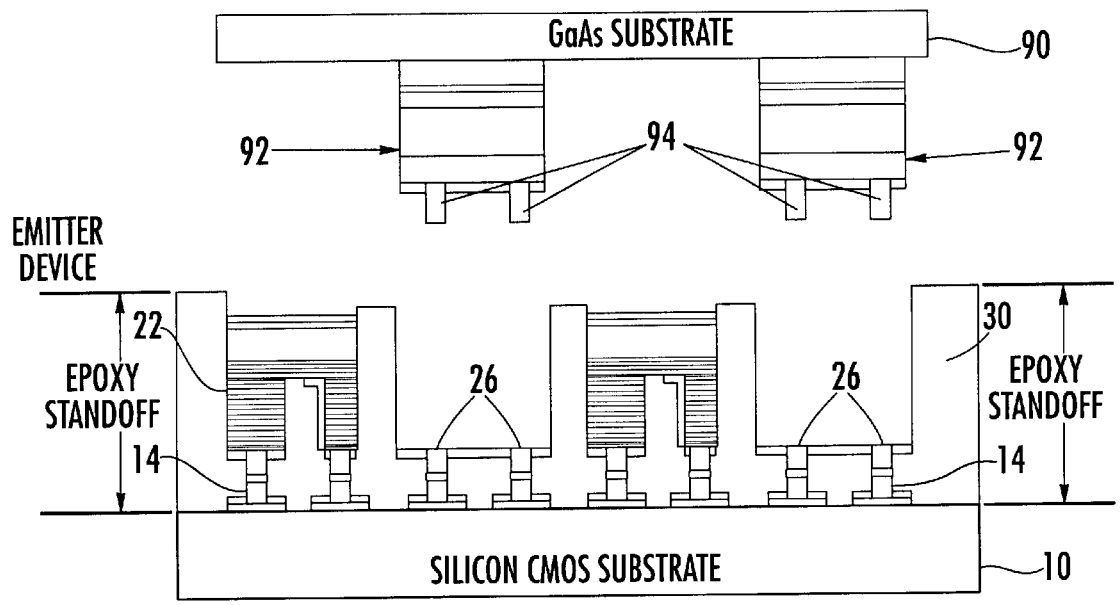
FIG. 9 is a cross-sectional view of the device of FIG. 8 with a second GaAs substrate, with second optical devices thereon, before hybridization.
Figure 10:
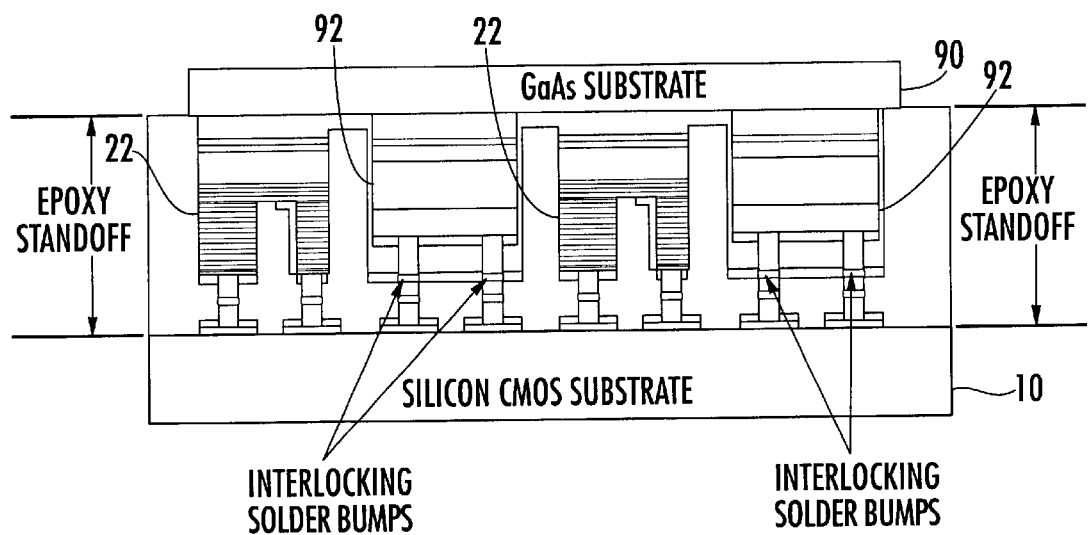
FIG. 10 is a cross-sectional view after hybridization of the second GaAs substrate.

FIG. 9 shows GaAs substrate 90, with photonic devices 92 grown thereupon. Photonic devices 92 are typically detectors or photodiodes. These detectors are typically shorter in height than emitters 22. To accommodate for this height difference, solder bumps 94, in combination with solder bumps 14 and 26 remaining after sacrificial devices 24 were removed, are provided with the appropriate height. Substrate 90 is pressed together with substrate 10 such that solder bumps 94 interlock with solder bumps 14 and 26 and is intended to form a good electrical and mechanical contact, as shown in FIG. 10.

Figure 11:
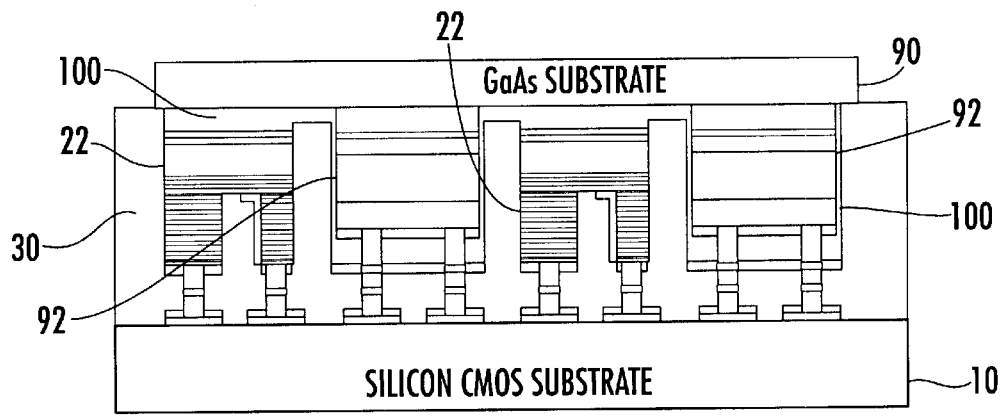
FIG. 11 is a cross-sectional view of the device of FIG. 10 after introduction of a second flowable hardenable material.

Flowable hardenable material 100, FIG. 11, is then introduced in the spaces between and around detectors 92 and flowable hardenable material 30. Flowable hardenable materials 30 and 100 may be the same composition or may differ in composition. Flowable hardenable material 100 is then cured by appropriate means once it is introduced, as for example, by UV light if a UV-curable epoxy is used. After curing, flowable hardenable material 100 provides mechanical stability for detectors 92.

Figure 12:
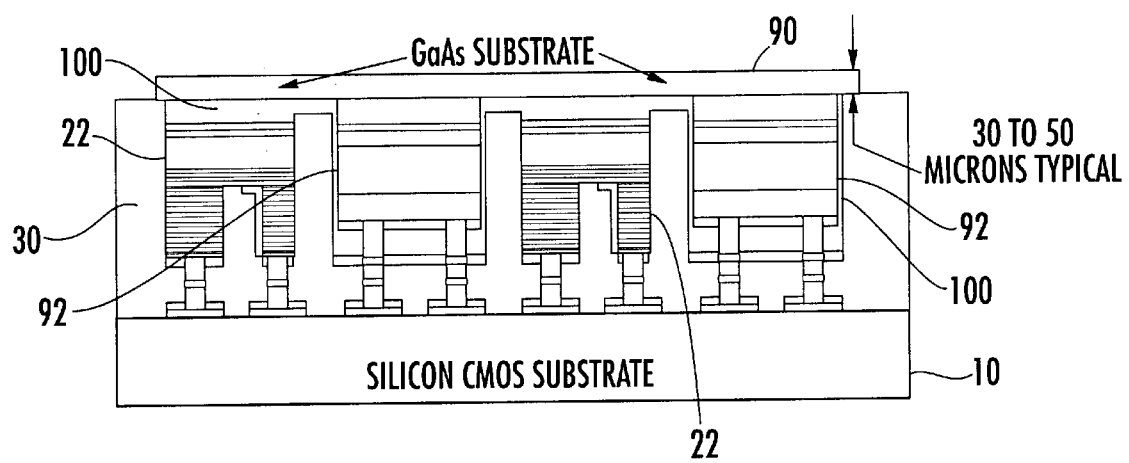
FIG. 12 is a cross-sectional view of the device of FIG. 11 after removal of most of the second GaAs substrate.
Figure 13:
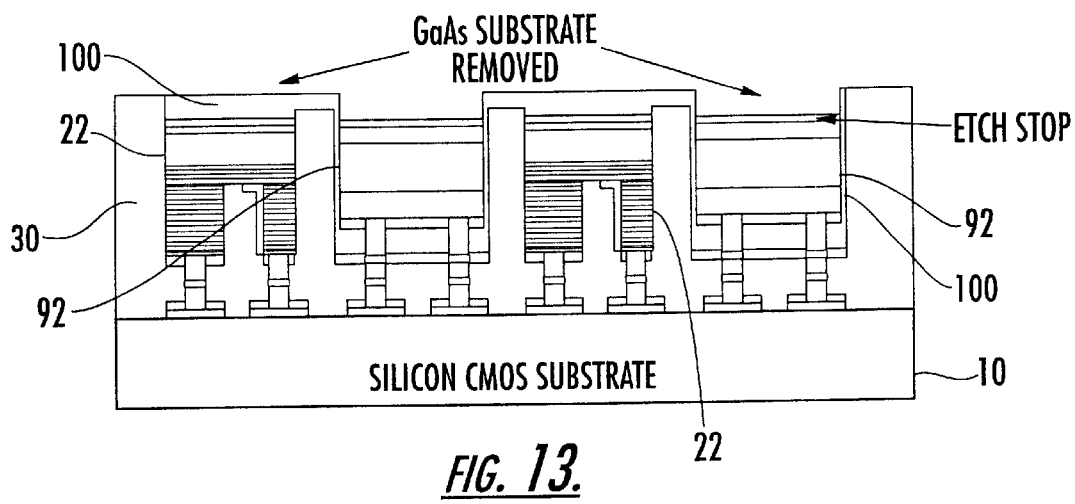
FIG. 13 is a cross-sectional view of the device of FIG. 12 after removal of the remainder of the second GaAs substrate.

A mechanical process, such as lapping, is used to reduce the thickness of substrate 90 to a range of about 30 to 50 microns, as shown in FIG. 12. A selective dry chemical etch is then used to remove the rest of substrate 90. Etch stop layer 110, FIG. 13, prevents the dry chemical etch advancing beyond that layer.

Figure 14:
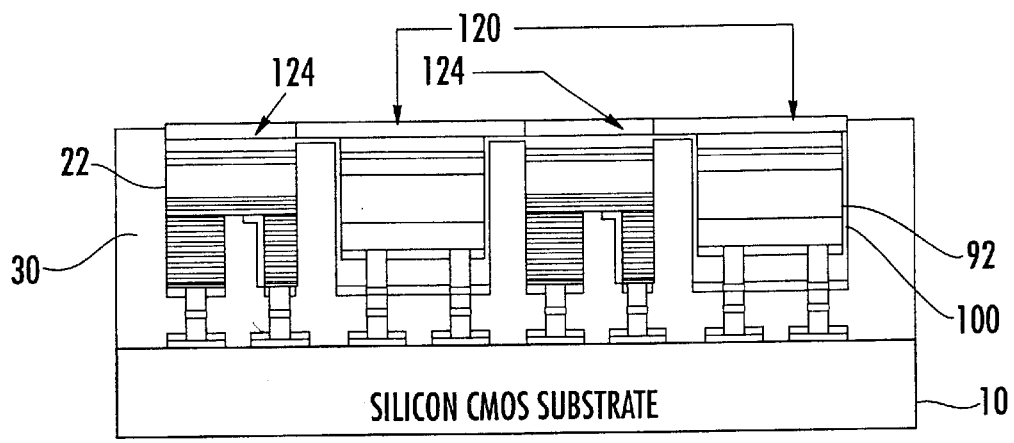
FIG. 14 is a cross-sectional view of the device of FIG. 13 with a process mask applied.

A second process mask 120, shown in FIG. 14, is placed over the integrated device to protect detectors 92 during a dry chemical etch which removes epoxy 100 and etch stop 110 from above detectors 92.

Figure 15:
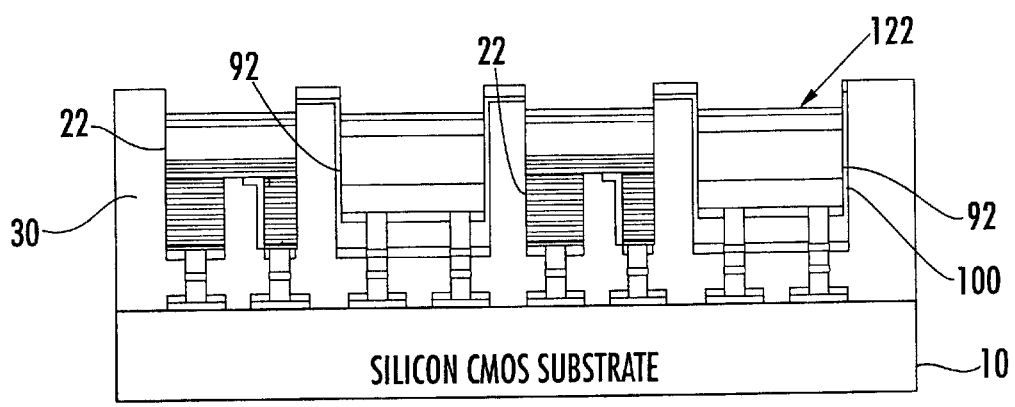
FIG. 15 is a cross-sectional view of the device of FIG. 14 after removal of epoxy from the first optical devices and the second etch stop layer over the second optical devices.

FIG. 15 illustrates the finished device 120. Anti-reflection coating 122 may be optionally applied to detectors 92 to allow light to enter the detector with minimum loss. This may help improve performance in some systems.

While the process has been described with respect to an interdigitated array of emitters and detectors in a hybrid Si/GaAs chip technology, it is possible to use this method for any number of types of photonic devices in other hybrid material chip technologies. For example, photonic devices such as modulators could be used. These modulators may be transmissive, reflective or absorptive and may modulate the amplitude, wavelength or phase of the received signal. Also, although the process has been described with respect to interdigitation of two different optical type devices, namely emitters and detectors, the process is expandable to three or more different types of optical devices in the same optoelectronic device.

The sacrificial devices may also be of exactly the same structure as the photonic devices. The photolithographic masking step will serve to protect the photonic devices to remain as part of the optoelectronic device while allowing the sacrificial devices to be removed.

Thus, although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Moreover, other embodiments will occur to those skilled in the art and are within the following claims:

What is claimed is:

1. A method of making a hybrid optoelectronic device, the method comprising:
   hybridizing a first substrate and a second substrate, said second substrate including at least one first type optical device and at least one sacrificial device;
   introducing a first flowable hardenable material to join said first and second substrates;
   curing said first flowable hardenable material;
   removing said second substrate;
   removing said at least one sacrificial device;
   hybridizing said first substrate and a third substrate, said third substrate including at least one second type optical device;
   introducing a second flowable hardenable material to join said first and third substrates;
   curing said second flowable hardenable material; and
   removing said third substrate.

2. The method of claim 1 wherein the first substrate is a silicon substrate containing integrated circuitry for a plurality of optical devices.

3. The method of claim 1 wherein the second and third substrates are chosen from the group of III–V materials, sapphire, and organic polymers.

4. The method of claim 3 wherein the second and third substrates are GaAs.

5. The method of claim 1 wherein the at least one first type optical device is an emitter.

6. The method of claim 1 wherein the at least one second type optical device is a detector.

7. The method of claim 1 wherein the at least one second type optical device is a modulator.

8. The method of claim 7 wherein the modulator is selected from the group of transmissive, reflective and absorptive modulators.

9. The method of claim 7 wherein the modulator operates to modulate the amplitude of a received signal.

10. The method of claim 7 wherein the modulator operates to modulate the wavelength of a received signal.

11. The method of claim 7 wherein the modulator operates to modulate the phase of a received signal.

12. The method of claim 1 wherein the first and second flowable hardenable materials are curable epoxy resins.

13. The method of claim 6 further comprising the step of applying an antireflective coating to the receiver.

* * * * *